United States Patent
Chang

(10) Patent No.: US 6,864,705 B2
(45) Date of Patent: Mar. 8, 2005

(54) OUTPUT BUFFER WITH LOW POWER/ GROUND BOUNCE NOISE AND METHOD FOR OPERATING THE SAME

(75) Inventor: Chi Chang, Taipei (TW)

(73) Assignee: Via Technololgies, Inc. (TW)

( * ) Notice: Subject to any disclaimer, the term of this patent is extended or adjusted under 35 U.S.C. 154(b) by 180 days.

(21) Appl. No.: 10/318,983

(22) Filed: Dec. 13, 2002

(65) Prior Publication Data

US 2003/0169067 A1 Sep. 11, 2003

(30) Foreign Application Priority Data

Mar. 11, 2002 (TW) ........................................ 91104466 A

(51) Int. Cl.⁷ .......................................... H03K 19/003
(52) U.S. Cl. ............................ 326/27; 326/87; 326/112
(58) Field of Search ........................... 326/27, 87, 112; 327/396

(56) References Cited

U.S. PATENT DOCUMENTS

| | | | | |
|---|---|---|---|---|
| 5,894,238 A | * | 4/1999 | Chien | 326/27 |
| 5,914,618 A | * | 6/1999 | Mattos | 326/27 |
| 6,094,086 A | * | 7/2000 | Chow | 326/27 |
| 6,265,892 B1 | * | 7/2001 | Jou et al. | 326/27 |

* cited by examiner

Primary Examiner—Michael Tokar
Assistant Examiner—Lam T. Mai
(74) Attorney, Agent, or Firm—Madson & Metcalf

(57) ABSTRACT

A method for operating an output buffer for reducing a power/ground bounce noise while maintaining high transmission rate is disclosed. The method includes steps of providing a plurality of driving current paths to an output end of the output buffer when an output end of the output buffer is switched from a low level to a high level, turning off a portion of the driving current paths when the output end of the output buffer is kept at the high level, providing a plurality of discharging current paths to the output end when the output end of the output buffer is switched from a high level to a low level, and turning off a portion of the discharging current paths when the output end of the output buffer is kept at the low level. In addition, an output buffer with both low power/ground bounce noise and high transmission rate is also disclosed.

16 Claims, 6 Drawing Sheets

US 6,864,705 B2

OUTPUT BUFFER WITH LOW POWER/ GROUND BOUNCE NOISE AND METHOD FOR OPERATING THE SAME

FIELD OF THE INVENTION

The present invention relates to an output buffer, and more particularly to an output buffer with a low power/ground bounce noise. The present invention also relates to a method for operating an output buffer in order to take both advantages of low power/ground bounce noise and high transmission rate.

BACKGROUND OF THE INVENTION

In a high speed digital circuit, the major noise is a power/ground bounce noise of an input/output end. Generally, when the output end of an output buffer is switching status, a power/ground bounce noise is derived from the flow of intense current through the parasitic inductance of the bonding wires, lead frame or pin. Please refer to FIG. 1 which is a schematic diagram showing conventional output buffers commonly electrically connected to a power voltage $V_{pp}$ and a ground voltage $V_{ss}$. The common voltage source of the output buffers $70_1$~$70_n$ is connected to a pad via a pin and a bonding wire. Meanwhile, the parasitic inductances of the pin and pad/bonding wire are generated, and the equivalent inductance is represented by an inductor $L_1$. Similarly, there is inductance equivalent to the parasitic inductances of the pin and pad/bonding wire between the output buffers $70_1$~$70_n$ and a ground $V_{ss}$, which is represented by $L_2$.

Since there are parasitic inductors $L_1$ and $L_2$ existing between the output buffers $70_1$~$70_n$ and the voltage source and ground, respectively, a power/ground bounce noise may occur when some of the output buffers $70_1$~$70_n$ change their output status. For example, when the output status of the output buffers $70_1$ and $70_2$ is switched from a low level to a high level, the power voltage $V_{pp}$ provides a driving current to the output buffers $70_1$ and $70_2$. At that moment, the instaneous change of the current causes an instaneous voltage drop of the parasitic inductor $L_1$, which is represented by the equation of $\Delta V_1 = L_1 \cdot di/dt$. Hence, all the output buffers $70_1$~$70_n$ receive a power voltage of $(V_{pp} - \Delta V_1)$. Even for the output buffer $70_{n-1}$ to maintain at the high level, the voltage thereof is decreased with the voltage drop resulting from the status-switching of the output buffers $70_1$ and $70_2$. It is so-called as power bounce noise. On the other hand, when the output status of the output buffers $70_1$ and $70_2$ changes from the high level to the low level, a discharge current will be provided from the output buffers $70_1$ and $70_2$ to ground. Such instaneous current change also results in an instaneous voltage drop ($\Delta V_2 = L_2 \times di/dt$) on the parasitic inductor $L_2$, so the ground voltage received by the output buffers $70_1$~$70_n$ becomes $(V_{ss} + \Delta V_2)$. Meanwhile, for the output buffer $70_n$ to maintain at the low level, the voltage thereof increases with the ground voltage drop, which is so-called as ground bounce noise. Those power/ground bounce noises possibly result in an erroneous signal. Moreover, the more output buffers are switching their output status at the same time, the more power/ground bounce noises occur.

Please refer to FIG. 2 which shows a conventional circuit design of one of the output buffers of FIG. 1. The input signals Dp and Dn are transmitted to NOT gates 72 and 74, respectively. The outputs of the NOT gates 72 and 74 are transmitted to gate electrodes of a P-channel metal-oxide-semiconductor (PMOS) transistor mp1 and a N-channel metal-oxide-semiconductor (NMOS) transistor mn1, respectively. The source electrode of the PMOS transistor mp1 is coupled to the voltage source while the drain electrode thereof is coupled to the output end OUT for generating an output signal Do. The source electrode of the NMOS transistor mn1 is coupled to ground while the drain electrode thereof is coupled to the output end.

For obtaining a high speed effect of the output buffer, the channel width of the MOS transistors mp1 and mn1 of the output buffer is required to be large enough for complying with large driving current and discharge current in the prior art. As is known, large current of the MOS transistor means lower equivalent resistance. Hence, when the power voltage and the ground voltage vary, larger power/ground bounce noises occur in case of larger current involved. Once the amplitude of the output end varies too much, it is possible to cause an error.

On the other hand, if the channel width of the MOS transistors in the output buffer is narrowed down in order to reduce power/ground bounce noises, the capability of the MOS transistors to generate the driving current and the discharge current is adversely effected. Thus the transmission rate and the performance are unsatisfactory.

Therefore, the purpose of the present invention is to take both advantages of high transmission rate and low power/ground bounce noises.

SUMMARY OF THE INVENTION

An object of the present invention is to provide an output buffer, which utilizes a plurality of driving current paths and/or discharge current paths to reduce the power/ground bounce noise while maintaining the transmission rate.

Another object of the present invention is to provide a method for operating an output buffer, which takes both advantages of high transmission rate and low power/ground bounce noise by properly switching on/off a plurality of driving current paths and/or discharge current paths included in the output buffer.

According to an aspect of the present invention, there is provided an output buffer in operation under a power voltage and a ground voltage. The output buffer includes an output end, a plurality of PMOS transistors interconnected between a voltage source for providing the power voltage and the output end in parallel, a plurality of NMOS transistors interconnected between a ground for providing the ground voltage and the output end in parallel, and a control circuit coupled to gates of the PMOS transistors and the NMOS transistors. A first number of the PMOS transistors are turned on in response to the switching status of the output end from a low level to a high level, a second number of the PMOS transistors are turned on in response to the continuous status of the output end at the high level, a third number of the NMOS transistors are turned on in response to the switching status of the output end from the high level to the low level, and a fourth number of NMOS transistors are turned on in response to the continuous status of the output end at the low level. The first number and the third number are greater than the second number and the fourth number, respectively.

In an embodiment, the control circuit includes a pulse generator that turns off a part of the PMOS transistors after the output end has been switched from the low level to the high level for a first time period. The output end preferably has a voltage value close to but lower then the high level at the end of the first time period.

In an embodiment, the control circuit includes a pulse generator that turns off a part of the NMOS transistors after the output end has been changed from the high level to the low level for a second time period. The output end preferably has a voltage value close to but higher than the low level at the end of the second time period.

According to another aspect of the present invention, there is provided a method for operating an output buffer. The method includes steps of providing a plurality of driving current paths to an output end of the output buffer when an output end of the output buffer is switched from a low level to a high level, turning off a portion of the driving current paths when the output end of the output buffer is kept at the high level, providing a plurality of discharging current paths to the output end when the output end of the output buffer is switched from a high level to a low level, and turning off a portion of the discharging current paths when the output end of the output buffer is kept at the low level.

Preferably, the driving current paths include a plurality of PMOS transistors interconnected between a voltage source and the output end in parallel.

Preferably, each of the discharging current paths includes a plurality of NMOS transistors interconnected between a ground and the output end in parallel.

Preferably, the portion of the driving current paths are turned off after the output end has been switched from the low level to the high level for a first time period. The output end preferably has a voltage value close to but lower than the high level at the end of the first time period.

Preferably, the portion of discharging current paths are turned off after the output end has been switched from the high level to the low level for a second time period. The output end preferably has a voltage value close to but higher than the low level at the end of the second time period.

According to a further aspect of the present invention, there is provided a method for operating an output buffer. The method includes steps of providing a plurality of driving current paths to an output end of the output buffer when the output end of the output buffer is switched from a low level to a high level, and turning off a portion of the driving current paths when the output end of the output buffer is kept at the high level.

Preferably, the method further includes steps of providing a plurality of discharging current paths to the output end when the output end of the output buffer is switched from a high level to a low level, and turning off a portion of the discharging current paths when the output end of the output buffer is kept at the low level.

According to a further aspect of the present invention, there is provided a method for operating an output buffer. The method includes steps of providing a plurality of discharging current paths to an output end of the output buffer when the output end of the output buffer is switched from a high level to a low level, and turning off a portion of the discharging current paths when the output end of the output buffer is kept at the low level.

Preferably, the method further includes steps of providing a plurality of discharging current paths to the output end when the output end of the output buffer is switched from a high level to a low level, and turning off a portion of the discharging current paths when the output end of the output buffer is kept at the low level.

DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
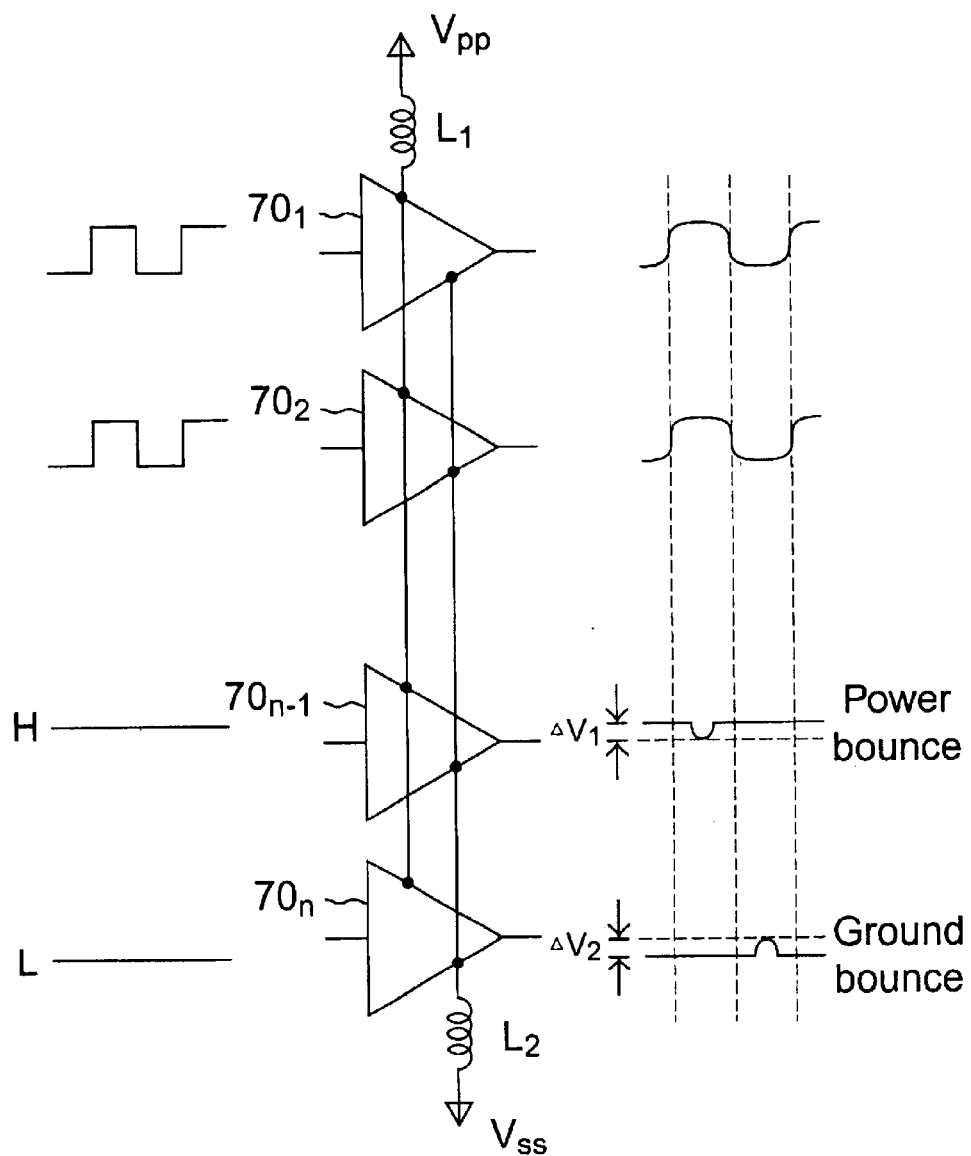
FIG. 1 is a schematic diagram illustrating conventional output buffers commonly electrically connected to a power voltage $V_{pp}$ and a ground voltage $V_{ss}$.
Figure 2:
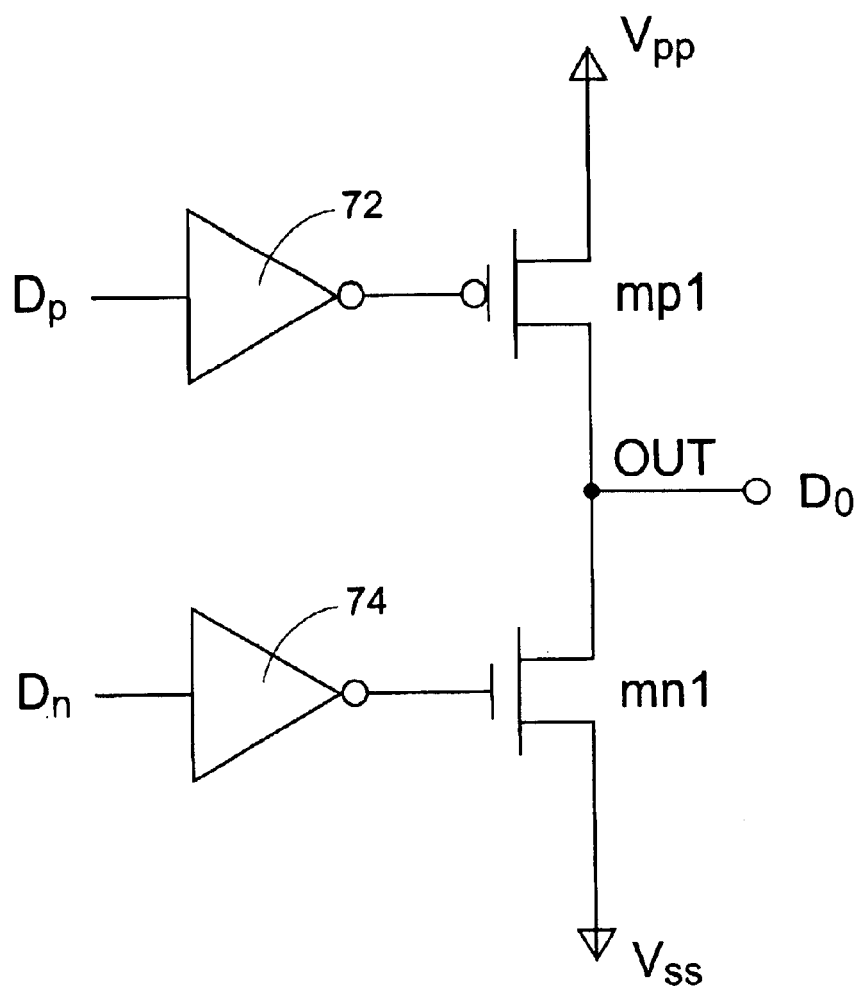
FIG. 2 is a schematic circuit diagram illustrating each of the output buffers of FIG. 1.
Figure 3:
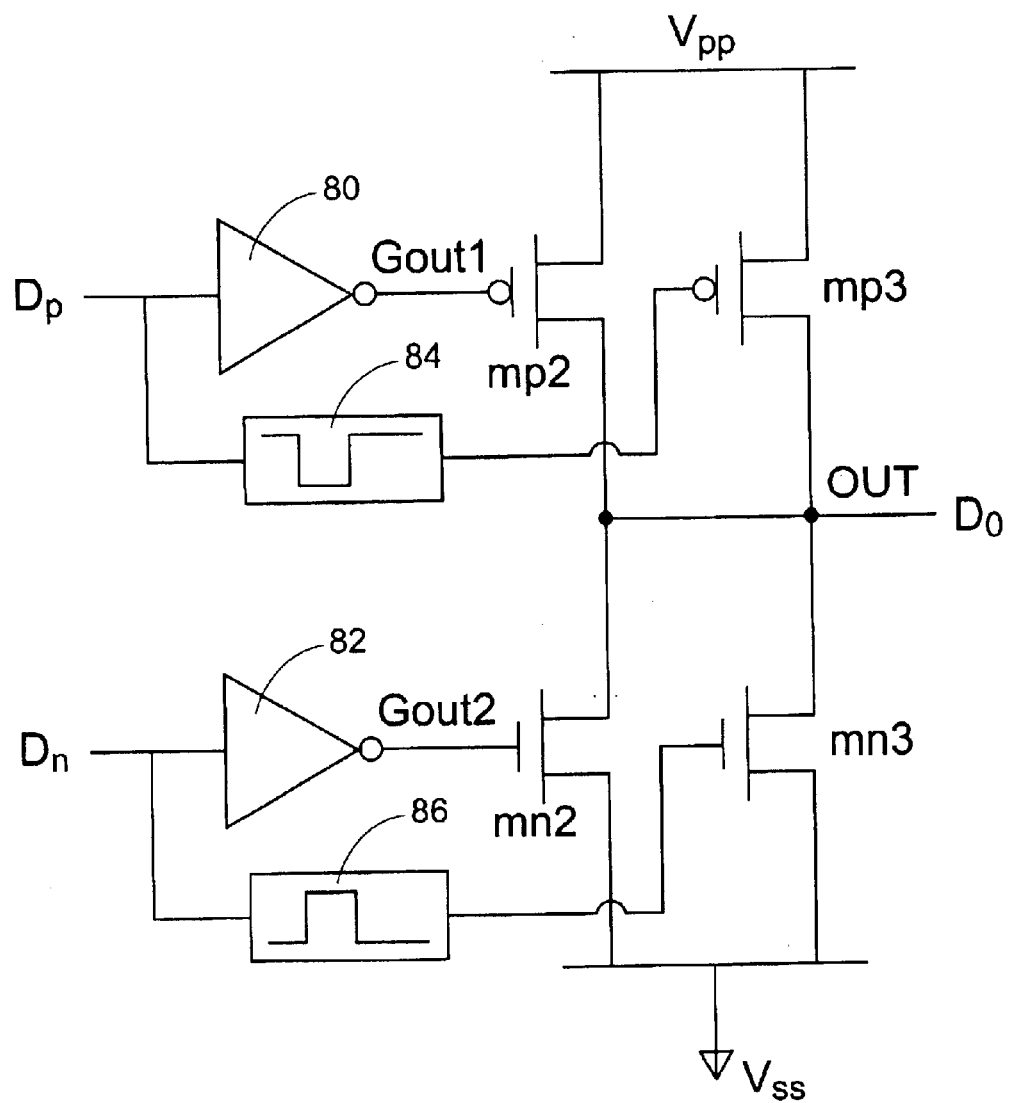
FIG. 3 is a schematic circuit diagram illustrating a preferred embodiment of an output buffer according to the present invention.

Please refer to FIG. 3 which is a schematic circuit diagram illustrating a preferred embodiment of an output buffer according to the present invention. The output buffer includes PMOS transistors mp2 and mp3, NMOS transistors mn2 and mn3, NOT gates 80 and 82, and pulse generators 84 and 86. As shown in FIG. 3, the PMOS transistor mp2 is connected to the PMOS transistor mp3 in parallel. The source electrodes and drain electrodes of the PMOS transistors mp2 and mp3 are coupled to a power voltage Vpp and an output end OUT. The NMOS transistors mn2 and mn3 are connected to each other in parallel. The source electrodes and drain electrodes of the NMOS transistors mn2 and mn3 are coupled to a ground voltage Vss and the output end OUT. For making input signals Dp and Dn consistent with an output signal Do, the input signals Dp and Dn are coupled to the NOT gates 80 and 82, respectively, and the outputs of the NOT gates 80 and 82 are coupled to the gate electrodes of the PMOS transistor mp2 and the NMOS transistor mn2, respectively. In addition, the input signals Dp and Dn are coupled to the pulse generators 84 and 86, and the output ends of the pulse generators 84 and 86 are coupled to the gate electrodes of the PMOS transistor mp3 and the NMOS transistor mn3, respectively.

As is understood by those skilled in the art, for assuring of the high speed effect in the output buffer, it is necessary to provide an relatively intense driving current to the output end of the output buffer for switching status, i.e. when the output end is switched from a low level to a high level or from a high level to a low level. Therefore, multiple current paths are provided to the output end of the output buffer, serving as multiple driving current paths or multiple discharging current paths, for switching status according to the present invention. On the other hand, for reducing the power/ground bounce noise, a larger push-up resistance or a pull-down resistance is preferably provided to the output end when the output end is in a steady state, thereby reducing the effect on the output end due to the variation of the power voltage or the ground voltage.

Figure 4:
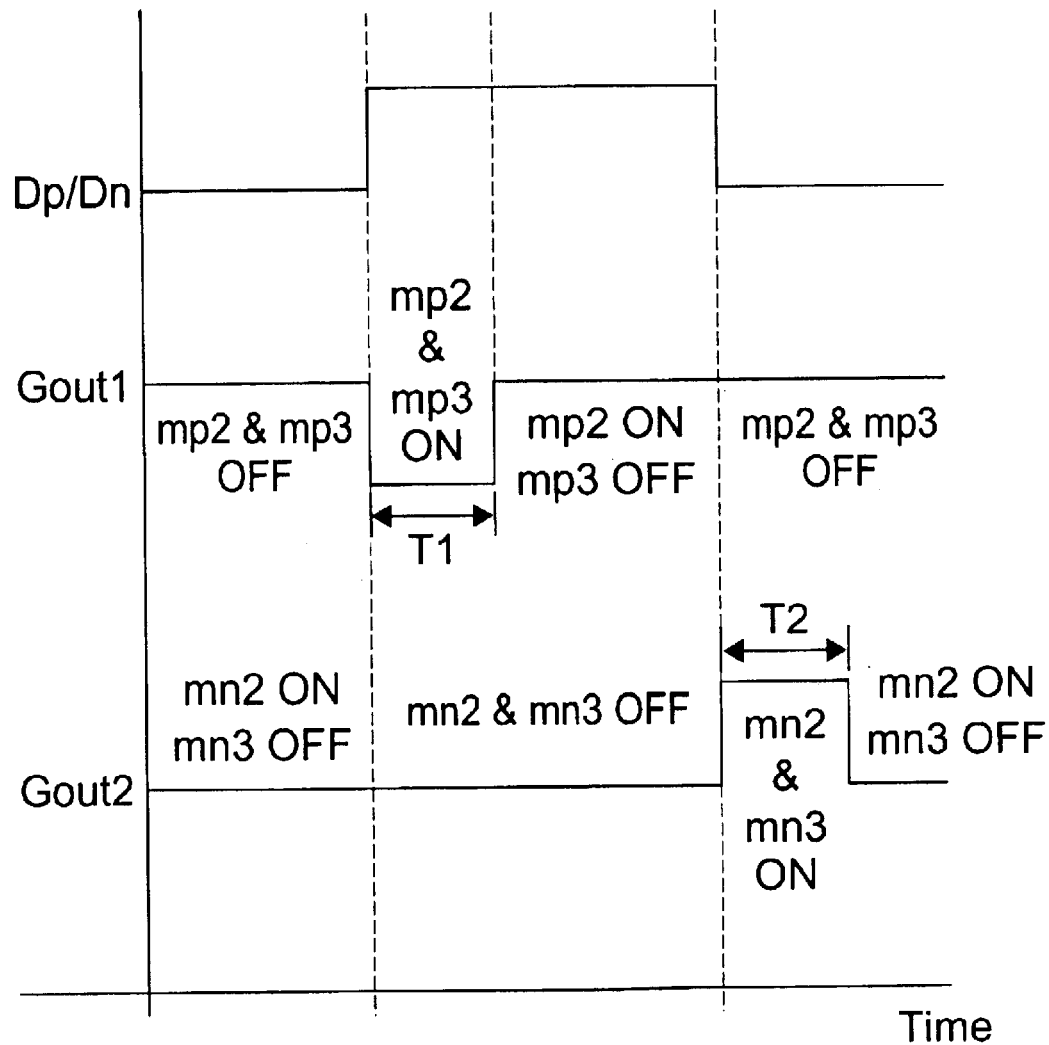
FIG. 4 is a schematic waveform diagram illustrating the operation of the output buffer of FIG. 3.

For complying with the above requirements, multiple driving current paths and multiple discharging current paths are provided and properly switched according to the present invention. Please refer to FIGS. 3 and 4. For providing intenser driving current to the output end OUT, a driving current path via the PMOS transistor mp3 is provided in addition to the driving current path via the PMOS transistor mp2. When the input signals Dp and Pn are switched from the low level to the high level, the NMOS transistors mn2 and mn3 are turned off, and the output of NOT gate 80 is switched from the high level to the low level, resulting in turning on the PMOS transistor mp2. Moreover, when receiving the input signal Dp switched from the low level to the high level, the output Gout1 of the pulse generator 84 is switched low for a time period T1, and then recovered high. Meanwhile, the PMOS transistor mp3 is also turned on. In other words, when the input signals Dp and Dn are switched from the low level to the high level, the driving current paths via both the PMOS transistors mp2 and mp3 are turned on. Thus, intenser driving current, compared to the conventional one-path output, is provided to quickly pull up the output status to the high level. After the time period T1, the PMOS transistor mp3 is turned off and only the PMOS transistor mp2 is kept "ON". The length of the time period T1 is set according to the practice.

Similarly, for intensifying discharging current, a discharging current path via the NMOS transistor mn3 is provided in addition to to the discharging current path via the NMOS transistor mn2. When the input signals Dp and Pn are switched from the high level to the low level, the PMOS transistors mp2 and mp3 are turned off, and the output of NOT gate 82 is switched from the low level to the high level, resulting in turning on the NMOS transistor mn2. On the other hand, when receiving the input signal Dn switched from the high level to the low level, the output Gout2 of the pulse generator 86 is switched high for a time period T2, and then recovered low. Meanwhile, the NMOS transistor mn3 is also turned on. In other words, when the input signals Dp and Dn are switched from the high level to the low level, both the NMOS transistors mn2 and mn3 are turned on. Thus, intenser discharging current is provided. After the time period T2, the NMOS transistor mn3 is turned off and only the NMOS transistor mn2 is kept "ON". The length of the time period T2 is set according to the practice.

According to the present invention, a plurality of current paths are provided to intensify the driving current or the discharge current, thereby speeding up the transmission rate at the output end of the output buffer. In another aspect, when the outputs and inputs reach a steady state, only one of the PMOS or NMOS transistors, i.e. mp2 or mn2, is kept ON to pull up or pull down the level. In this embodiment, small channel width and thus high equivalent resistance of the MOS transistors mp2 and mn2 are provided in order to reduce the power/ground bounce noise. Thus, when the variation of power voltage or ground voltage is caused by the change of the output buffer status, little effect works on the output buffer according to the present invention. In other words, the output buffer according to the present invention can efficiently reduce the power/ground bounce noise.

Certainly, for providing even intense driving current and discharge current, more current paths can be provided. The number of the PMOS and NMOS transistors connected in parallel is not particularly limited herein, and depends on the required feature of the output buffer. The switching on/off pattern is also not particularly limited herein, and depends on practice.

Figure 5A:
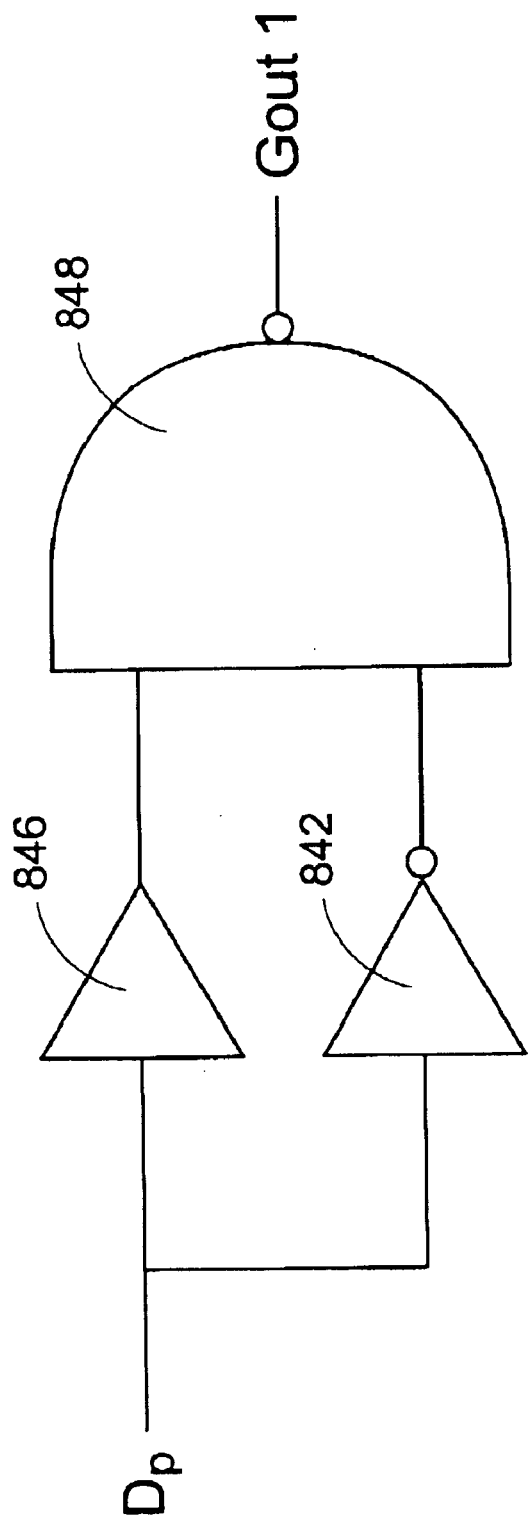
FIG. 5A is a schematic circuit diagram illustrating an embodiment of the pulse generator of FIG. 3.

Please refer to FIG. 5A which is an embodiment of the pulse generator 84 in FIG. 3. The pulse generator 84 includes a delay device 842 consisting of an odd number of NOT gates interconnected in series (not shown), a buffer gate 846 and a NAND gate 848. The output ends of the delay device 842 and the buffer gate 846 are coupled to the NAND gate 848. When the input signal Dp inputted to the delay device 842 and the buffer gate 846 is kept at the low level, the output of NAND gate 848 is at a high level. When the input signal Dp is switched from the low level to the high level, the output of the NAND gate 848 becomes low for the time period T1. After the time period T1, the output of the NAND gate 848 is back to the high level. The length of the time period T1 is dependent on the number of the NOT gates included in the delay device 842.

Figure 5B:
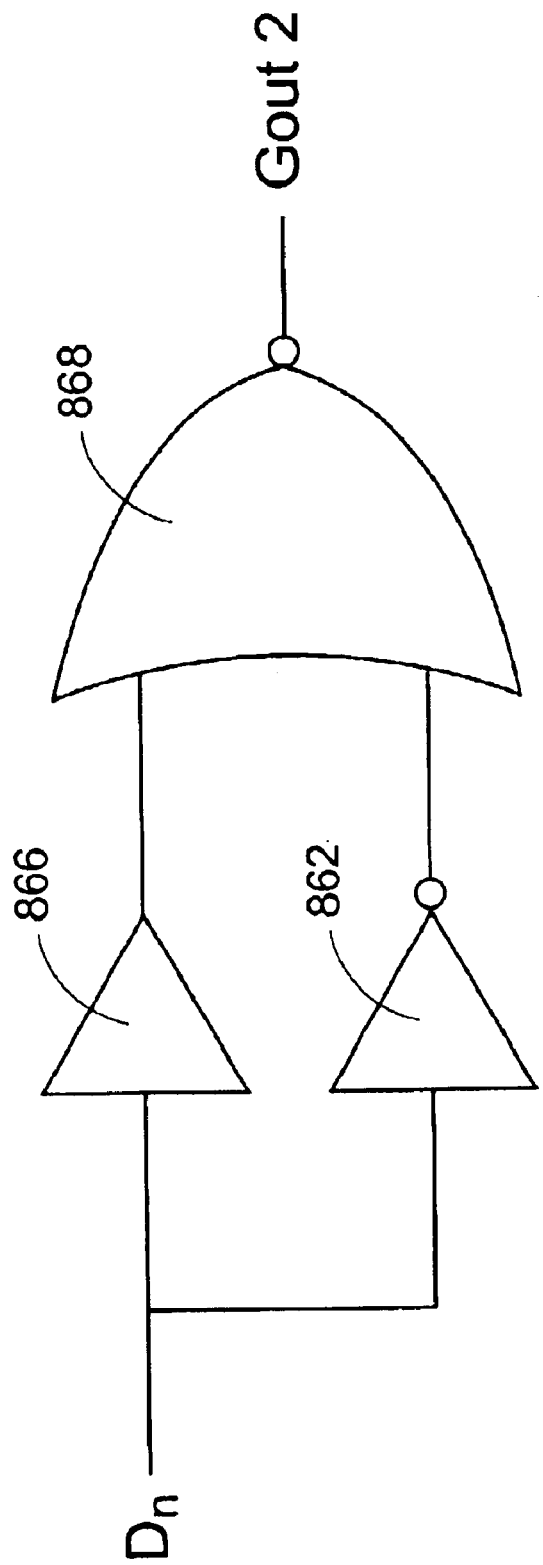
FIG. 5B is a schematic diagrams illustrating another embodiment of the pulse generator of FIG. 3.

Please refer to FIG. 5B which is an embodiment of the pulse generator 86 in FIG. 3. The pulse generator 86 generating the high level for the time period T2 includes a delay device 862, for example an odd number of NOT gates connected in series, a buffer gate 866 and a NOR gate 868. As shown in FIG. 5B, the output ends of the delay device 862 and the buffer gate 866 are coupled to the NOR gate 868. In the normal condition, when the input signal Dn is inputted to the delay device 862 and the buffer gate 866, the output of the NOR gate 868 is the low level. Only the input signal Dn is switched from the high level to the low level, the NOR gate 868 outputs the high level for the time period T2. After the time period T2, the level is back to the low level. Likewise, the length of the time period T2 is dependent on the number of the NOT gates in the delay device 862.

To sum up, In status-switching stage, a plurality of driving current paths or discharge current paths are enabled so as to quickly reach a stable status at the output end. On the other hand, when the output status is stable, a high resistance path is enabled at the output end for pulling up or pulling down the resistance to efficiently reduce a power/ground bounce noise.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An output buffer in operation under a power voltage and a ground voltage, comprising:

an output end;

a plurality of PMOS transistors interconnected between a voltage source for providing said power voltage and said output end in parallel;

a plurality of NMOS transistors interconnected between a ground for providing said ground voltage and said output end in parallel; and a control circuit coupled to gates of said PMOS transistors and said NMOS transistors, wherein a first number of said PMOS transistors are turned on in response to the switching status of said output end from a low level to a high level, a second number of said PMOS transistors are turned on in response to the continuous status of said output end at said high level, a third number of said NMOS transistors are turned on in response to the switching status of said output end from said high level to said low level, and a fourth number of NMOS transistors are turned on in response to the continuous status of said output end at said low level, and wherein said first number and said third number are greater than said second number and said fourth number, respectively.

2. The output buffer according to claim 1 wherein said control circuit comprises a pulse generator that turns off a part of said PMOS transistors after said output end has been switched from said low level to said high level for a first time period.

3. The output buffer according to claim 2 wherein said output end has a voltage value close to but lower than said high level at the end of said first time period.

4. The output buffer according to claim 1 wherein said control circuit comprises a pulse generator that turns off a part of said NMOS transistors after said output end has been changed from said high level to said low level for a second time period.

5. The output buffer according to claim 4 wherein said output end has a voltage value close to but higher than said low level at the end of said second time period.

6. A method for operating an output buffer, comprising steps of:

providing a plurality of driving current paths to an output end of said output buffer when said output end of said output buffer is switched from a low level to a high level;

turning off a portion of said driving current paths when said output end of said output buffer is kept at said high level;

providing a plurality of discharging current paths to said output end when said output end of said output buffer is switched from a high level to a low level; and turning off a portion of said discharging current paths when said output end of said output buffer is kept at said low level.

7. The method according to claim 6 wherein said driving current paths includes a plurality of PMOS transistors interconnected between a voltage source and said output end in parallel.

8. The method according to claim 6 wherein each of said discharging current paths includes a plurality of NMOS transistors interconnected between a ground and said output end in parallel.

9. The method according to claim 6 wherein said portion of said driving current paths are turned off after said output end has been switched from said low level to said high level for a first time period.

10. The method according to claim 9 wherein said output end has a voltage value close to but lower than said high level at the end of said first time period.

11. The method according to claim 6 wherein said portion of discharging current paths are turned off after said output end has been switched from said high level to said low level for a second time period.

12. The method according to claim 11 wherein said output end has a voltage value close to but higher than said low level at the end of said second time period.

13. A method for operating an output buffer, comprising steps of:

providing a plurality of driving current paths to an output end of said output buffer when said output end of said output buffer is switched from a low level to a high level; and turning off a portion of said driving current paths when said output end of said output buffer is kept at said high level.

14. The method according to claim 13 further comprising steps of:

providing a plurality of discharging current paths to said output end when said output end of said output buffer is switched from a high level to a low level; and turning off a portion of said discharging current paths when said output end of said output buffer is kept at said low level.

15. A method for operating an output buffer, comprising steps of:

providing a plurality of discharging current paths to an output end of said output buffer when said output end of said output buffer is switched from a high level to a low level; and turning off a portion of said discharging current paths when said output end of said output buffer is kept at said low level.

16. The method according to claim 15 further comprising steps of:

providing a plurality of discharging current paths to said output end when said output end of said output buffer is switched from a high level to a low level; and turning off a portion of said discharging current paths when said output end of said output buffer is kept at said low level.

* * * * *